(12) United States Patent
Kim

(10) Patent No.: US 8,933,736 B2
(45) Date of Patent: Jan. 13, 2015

(54) DELAY-LOCKED LOOP (DLL) CIRCUIT APPARATUS AND METHOD FOR LOCKING THEREOF

(71) Applicant: MagnaChip Semiconductor, Ltd., Cheongju-si (KR)

(72) Inventor: Jung Hyun Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/247,672

(22) Filed: Apr. 8, 2014

(65) Prior Publication Data

US 2014/0347107 A1 Nov. 27, 2014

(30) Foreign Application Priority Data

May 22, 2013 (KR) .................. 10-2013-0058006

(51) Int. Cl.
*H03L 7/06* (2006.01)
*H03L 7/08* (2006.01)

(52) U.S. Cl.
CPC .................................. *H03L 7/0802* (2013.01)
USPC ........................................ 327/158; 327/149

(58) Field of Classification Search
None
See application file for complete search history.

(56) References Cited

U.S. PATENT DOCUMENTS

| | | | |
|---|---|---|---|
| 8,553,473 B2 * | 10/2013 | Kim et al. | 365/189.07 |
| 8,704,565 B2 * | 4/2014 | Uo | 327/158 |
| 2008/0030247 A1 * | 2/2008 | Haerle et al. | 327/157 |

* cited by examiner

*Primary Examiner* — Cassandra Cox
(74) *Attorney, Agent, or Firm* — NSIP Law

(57) ABSTRACT

A DLL circuit apparatus and a DLL locking method are provided. A control signal voltage value corresponding to a DLL locking state is stored, and a DLL unlocking state is detected when a change in control signal voltage value or a phase difference of clock signals occurs. When the DLL unlocking occurs, the DLL is locked again using the stored control signal voltage value. Accordingly, DLL unlocking from DLL locking state is quickly detected, and a fast DLL locking time occurs.

19 Claims, 6 Drawing Sheets

FIG. 1
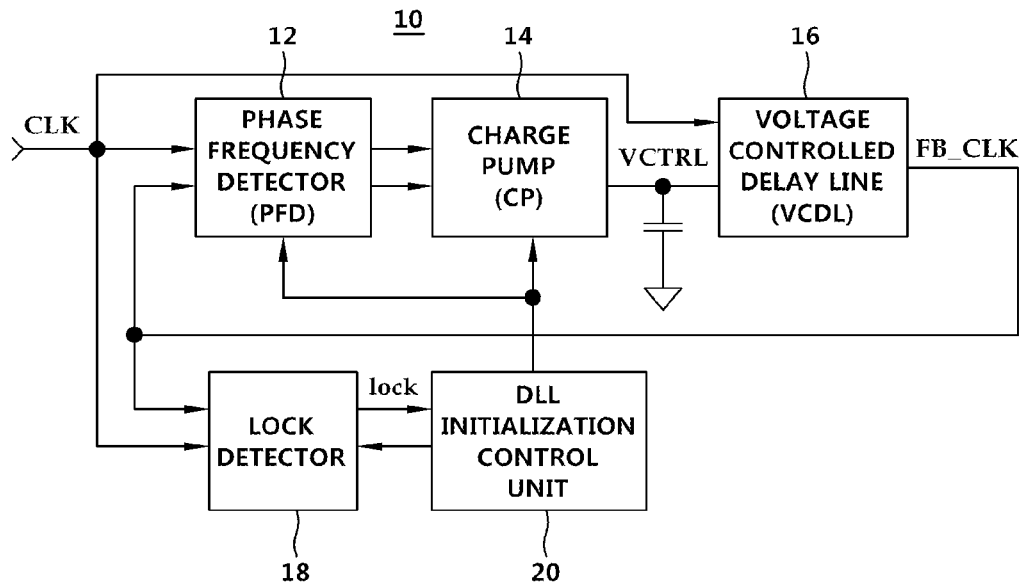
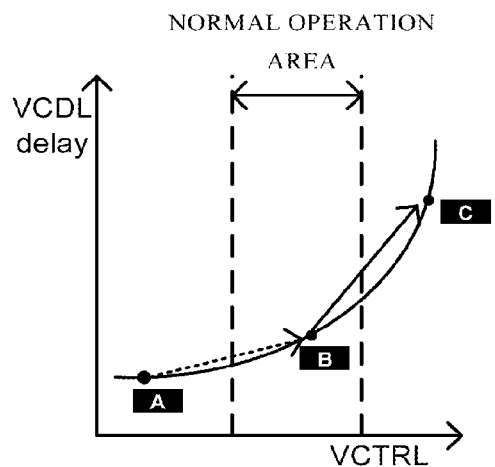
FIG. 2A
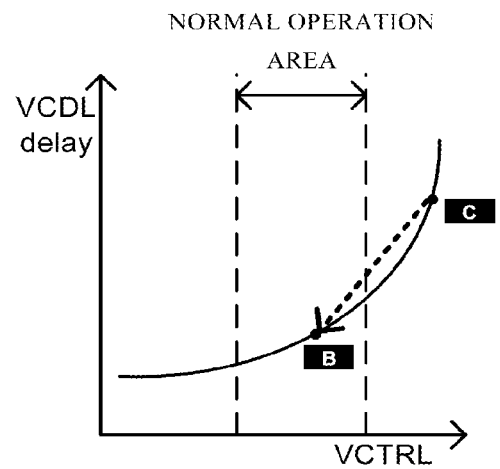
FIG. 2B

DELAY-LOCKED LOOP (DLL) CIRCUIT APPARATUS AND METHOD FOR LOCKING THEREOF

CROSS-REFERENCE TO RELATED APPLICATIONS

This application claims the benefit under 35 U.S.C. §119 (a) of Korean Patent Application No. 10-2013-0058006 filed on May 22, 2013, in the Korean Intellectual Property Office, the entire disclosure of which is incorporated by reference for all purposes.

BACKGROUND

1. Field

The following description relates to delay-locked loop (DLL) locking. Also, the following description relates to a DLL circuit apparatus with improved DLL locking speed that performs a DLL locking operation within a shortened time, and a corresponding DLL locking method.

2. Description of Related Art

Ongoing efforts attempt to increase the processing speed of semiconductor memory devices while minimizing power consumption. These efforts attempt to address increasing demand for lower power consumption and faster processing by semiconductor memory devices. Because many semiconductor memory devices are portable devices that use a battery with limited energy supplies, the ability to provide lower power consumption extends the time such devices may be used, while faster processing improves the performance of the devices.

To help achieve lower power consumption and faster processing, the delay times of the internal circuits of the semiconductor memory devices may be compensated. To perform such compensation, input and output signals of the semiconductor memory device are synchronized with an external clock signal. To achieve this synchronization, the semiconductor memory device operating in synchronization with such a clock signal includes an internal clock generator such as a delay-locked loop (DLL) that receives an external clock signal and generates an appropriate internal clock signal.

That is, the DLL delays an external clock signal externally supplied to it, to generate an internal clock signal to drive a data output buffer. By doing so, output data is provided in response to the internal clock and in agreement with a rising edge or a falling edge of the external clock.

FIG. 1 is a circuit diagram of a DLL circuit.

Referring to FIG. 1, the DLL circuit 10 includes a phase frequency detector (PFD) 12 that compares a phase difference between an external clock signal (CLK) and a feedback internal clock signal (FB_CLK), and outputs a signal based on the result of the comparison. For example, the signal that results from the comparison is a rising edge pulse signal or falling edge pulse signal according to the relationship of the above two clock signals.

A charge pump (CP) 14 is provided to receive the rising or falling edge pulse signal as two input pulse signals from the PFD 12. The CP 14 converts these two pulse signals into voltage signals, extracts a DC component through a loop filter (not illustrated) and outputs a control signal voltage value (VCTRL) to vary the delay time.

A voltage controlled delay line (VCDL) 16 is provided so that when the control signal voltage value (VCTRL) is delivered, the VCDL 16 adjusts an external clock in accordance with the delay time and generates an internal clock signal. The clock signal of the VCDL 16, FB_CLK, is fed back to the PFD 12.

The DLL circuit 10 also includes a DLL initialization control unit 20 that initializes the DLL operation according to a detection result of a lock detector 18. The lock detector 18 detects whether the VCTRL is in a normal operation domain, which occurs when the DLL circuit 10 is normally driven. The DLL initialization control unit 20 initializes the PFD 12 and the CP 14 when the FB_CLK frequency is detected as deviating from the normal operation domain by the lock detector 18.

As explained above, the DLL circuit 10 continuously compares the internal feedback clock (FB_CLK) with the external clock (CLK). Based on the comparison, the DLL circuit 10 performs DLL locking while varying the VCTRL in accordance with the phase difference as determined by the comparison process. The 'DLL locking' as used herein refers to when the frequency and phase of the external clock (CLK) and internal clock (FB_CLK) are conformed to each other.

However, the control signal may sometimes take on an undesirable voltage value. For example, when the DLL circuit 10 of FIG. 1 is affected by an electrostatic discharge (ESD) or external noise generated by external effects, or the like, VCTRL varies and DLL locking has to be performed again. When the control signal takes on an undesirable voltage value, it takes a considerable amount of time to perform the DLL locking again. This issue is discussed further below.

FIG. 2 is a graph representing the relationship between the VCDL and the VCTRL that is the output from the CP, when external noise is applied.

When the DLL circuit 10 operates, with reference to FIG. 2A, the starting point, which is point A, moves to point B, so that DLL locking is performed. Point B is in the normal operation domain of the DLL circuit 10.

However, the VCTRL may sometimes deviate from the normal operation domain. For example, the deviation may occur due to influence of ESD or external noise, as discussed previously. That is, with references to FIG. 2B, point B may instantly move to point C due to such a deviation. In this case, the DLL circuit has to move VCTRL from point C back to point B for the purpose of DLL locking so that it will be back in the normal operation domain.

However, in such a situation, existing approaches take approximately several dozens of μs to move VCTRL back to the normal operation domain. Such time requirements are not very different from the initial DLL locking time that is done at the DLL circuit 10 at early stages of using the DLL circuit 10.

As a result, undesirable data appears on certain lines of the screen of the device using a DDI chip that uses such a DLL circuit 10.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Various examples provide a DLL circuit apparatus and a corresponding DLL locking method. For example, these examples are able to shorten a locking time to return a control signal voltage value to a normal operation domain when the control signal voltage deviates from the normal operational domain of the DLL locking, and thus provide fast data recovery.

In one general aspect, a delay-locked loop (DLL) circuit apparatus includes a storage configured to store a control signal voltage value corresponding to a DLL locking state as a reference voltage value, a lock detector configured to determine when a DLL unlocking state occurs using an external clock signal and a feedback internal clock signal, a level determiner configured to determine when a DLL unlocking state occurs using a level of a control signal voltage value, and an initializer configured to receive a reset signal from at least one of the lock detector and the level determiner in response to determining that the DLL unlocking state occurs, and configured to reset a control signal voltage value of the DLL circuit apparatus to the reference voltage value as stored in the storage in response to receiving the reset signal.

The lock detector may be configured to detect a phase difference between the external clock signal and the feedback internal clock signal, and configured to determine that the DLL unlocking state occurs in response to detecting the phase difference.

The lock detector may include a plurality of flip-flops configured to receive the external clock signal and the feedback internal clock signal, and an AND gate configured to calculate an AND operation of output signals received from the flip-flops and output the result of the AND operation as a high logic signal or a low logic signal.

The plurality of flip-flops may be DQ flip-flops.

The result of the AND operation may be transmitted to the initializer as a reset signal.

The level determiner may include a first comparator configured to compare the control signal voltage value with a minimum DLL locking voltage value, a second comparator configured to compare the control signal voltage value with a maximum DLL locking voltage value, and an OR gate configured to output the reset signal to the initializer in response to the control signal voltage value being less than the minimum DLL locking voltage value or greater than the maximum DLL locking voltage value.

The storage may include a sampler configured to sample the control signal voltage value in synchronization with the external clock signal, when the DLL circuit apparatus is in a locking state, and a hold unit configured to store the sampled control signal voltage value.

At least one of the sampler and the hold unit may further include an amplifier.

The hold unit may be configured to provide the stored control signal voltage value to the initializer as the reference voltage value.

In another general aspect, a delay-locked loop (DLL) locking method includes storing a control signal voltage value corresponding to a DLL locking state as a reference voltage value, determining when a DLL unlocking state occurs by comparing an external clock signal and a feedback internal clock signal, or by detecting a change in level of the control signal voltage value, and performing DLL locking by resetting the control signal voltage value in the DLL unlocking to the stored reference voltage value in response to detecting the DLL unlocking.

Determining when a DLL unlocking state occurs may include comparing phases of the external clock signal and the feedback internal clock signal.

Detecting when the DLL unlocking state may further include determining that the DLL unlocking occurs in response to the phases being different.

Detecting that the DLL unlocking occurs may further include determining that the DLL unlocking occurs in response to the control signal voltage value deviating from a normal operation range.

The normal operation range may be a normal operation range of a voltage controlled delay line for receiving the control signal voltage value and generating an internal clock signal.

Resetting the control signal voltage value in the DLL may include changing a setting of a charge pump of the DLL.

In another general aspect a delay-locked loop (DLL) circuit apparatus includes a lock detector configured to generate a reset signal in response to a DLL unlocking state being determined to occur using an external clock signal and a feedback internal clock signal, a level determiner configured to generate a reset signal in response to a DLL unlocking state being determined to occur using a level of a control signal voltage value, and an initializer configured to reset a control signal voltage value of the DLL circuit apparatus to a stored reference voltage value corresponding to a DLL locking state in response to the reset signal being generated.

The lock detector may be configured to detect a phase difference between the external clock signal and the feedback internal clock signal, and configured to generate the reset signal in response to detecting the phase difference.

The DLL circuit apparatus may further include a storage configured to store a control signal voltage value corresponding to a DLL locking state as the reference voltage value.

The level determiner may include a first comparator configured to compare the control signal voltage value with a minimum DLL locking voltage value, a second comparator configured to compare the control signal voltage value with a maximum DLL locking voltage value, and an OR gate configured to generate the reset signal in response to the control signal voltage value being less than the minimum DLL locking voltage value or greater than the maximum DLL locking voltage value.

A DLL circuit apparatus constructed as explained above, and a corresponding DLL locking method has the following characteristics.

As discussed, a control signal voltage value applied to a voltage controlled delay line varies when phases of external and internal clock signals vary, such as due to electrostatic discharge (ESD) or external power noise, from a DLL locking state. In response to such variance, the control signal voltage value with a varied level is reset to a previously-stored reference voltage value, that is, the control signal voltage value at the time of DLL locking.

Accordingly, when the DLL unlocks from the DLL locking state, such an unlocked state is detected quickly and a related locking operation is also performed quickly, so that DLL locking time is faster than other approaches.

Other features and aspects will be apparent from the following detailed description, the drawings, and the claims.

BRIEF DESCRIPTION OF THE DRAWINGS

FIG. 1 is a circuit diagram of a DLL circuit.

FIGS. 2A and 2B are graphs representing relationship between voltage controlled delay line and control signal voltage value which is the output from the charge pump, when external noise is applied.

Figure 3:
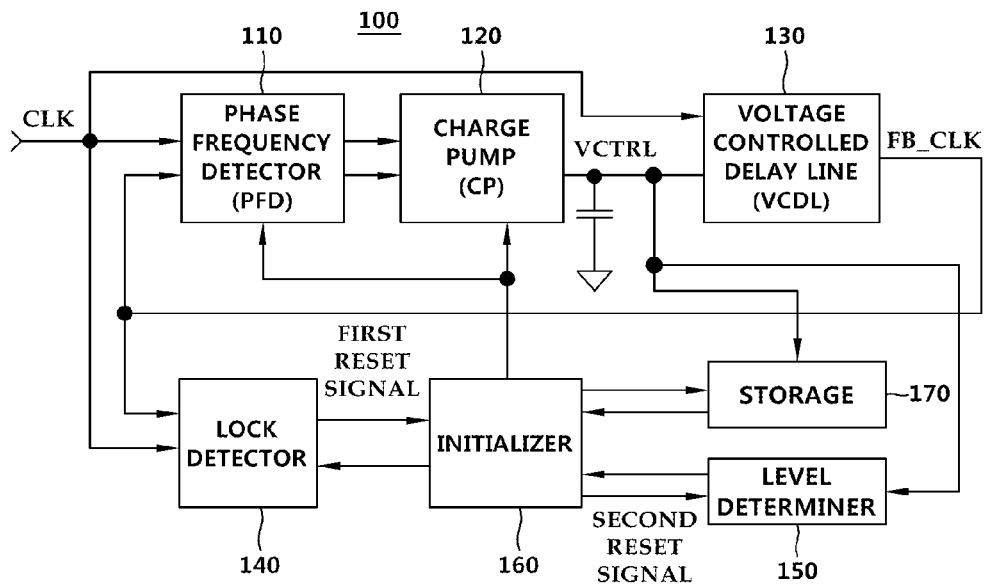
FIG. 3 is a block diagram of a DLL circuit apparatus, according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Various examples are able to shorten a DLL circuit locking time that is taken when a control signal voltage value of a DLL circuit deviates from a normal operation domain, such as due to electrostatic discharge (ESD) or external noise. Display products, such as monitors, TVs, or cellular phones, that are available have higher operating frequencies than previous, similar devices. Accordingly, in such devices with higher operating frequencies, the DLL frequency of the interior of the display driver IC (DDI) also becomes faster. Accordingly, a DLL with a faster locking time is suitable for such devices.

A DLL circuit apparatus and a corresponding DLL locking method, according to an example, are described further below with reference to accompanying drawings.

FIG. 3 is a block diagram of a DLL circuit apparatus, according to an example.

Referring to FIG. 3, the DLL circuit 100 includes a phase frequency detector (PFD) 110 configured to receive an external clock signal (CLK) and feedback an internal clock signal (FB_CLK), compare a phase difference between the two clock signals, and output a rising or falling edge pulse signal according to a result of the comparison.

A charge pump (CP) 120 receives the rising or falling edge pulse signal as two input pulse signals from the PFD 110. The CP 120 converts these two pulse signals into voltage signals and outputs a control signal voltage value (VCTRL) to vary delay time.

A voltage controlled delay line (VCDL) 130 is included so that the VCDL 130 adjusts the external clock signal (CLK) based on the delay time according to the control signal voltage value (VCTRL) and generates the internal clock signal (FB_CLK).

The internal clock signal (FB_CLK) outputted from the VCDL 130 is fed back to the PFD 110.

Meanwhile, in an example, a lock detector 130 and a level determiner 150 are included to help determine the unlocking state for the DLL.

The lock detector 140 receives the feedback internal clock signal (FB_CLK) from the VCDL 130 and the external clock signal (CLK) and compares their phase difference. Based on the comparison, the lock detector 140 determines that the DLL circuit 100 is in a locking state when the determined phase difference is within a predetermined range.

By contrast, the lock detector 140 determines the DLL is in an unlocking state, when the phase difference between the external clock signal (CLK) and feedback internal clock signal (FB_CLK) deviates from the predetermined range discussed above.

In the DLL unlocking state, the lock detector 140 outputs a first reset signal to reset the CP 120 to a previously stored reference voltage value.

The level determiner 150 determines if the control signal voltage value of the DLL locking state is within the operating range of the VCDL 130. If the control signal voltage value deviates from the operating range of the VCDL 130, a DLL unlocking state is determined. When the DLL unlocking state is determined as discussed, the level determiner 150 outputs a second reset signal to reset the CP 120 to a previously stored reference voltage. Resetting the CP 120 means resetting the control signal voltage value (VCTRL) to this previously stored reference voltage.

An initializer 160 is included so that when the first reset signal is applied from the lock detector 140 or the second reset signal is applied from the level determiner 150, the initializer 160 outputs a reset signal to reset the CP 120 to the CP 120. During the reset of the CP 120, the initializer 160 resets the VCTRL outputted from the CP 120, using the previously stored reference voltage value.

The previously stored reference voltage value, discussed above, refers to a control signal voltage value corresponding to the DLL being in a locking state. That is, the reference voltage value is a control signal voltage value outputted from the CP 120 when the DLL circuit 100 is in its normal operation state. A storage 170 is included to store such a reference voltage value. The reference voltage value stored in the storage 170 is delivered to the initializer 160, after the reset signal is outputted from the lock detector 140 or the level determiner 150.

Next, the architecture of the lock detector 140, the level determiner 150 and the storage 170 illustrated in FIG. 3 will be explained with reference to FIGS. 4 to 7.

Figure 4:
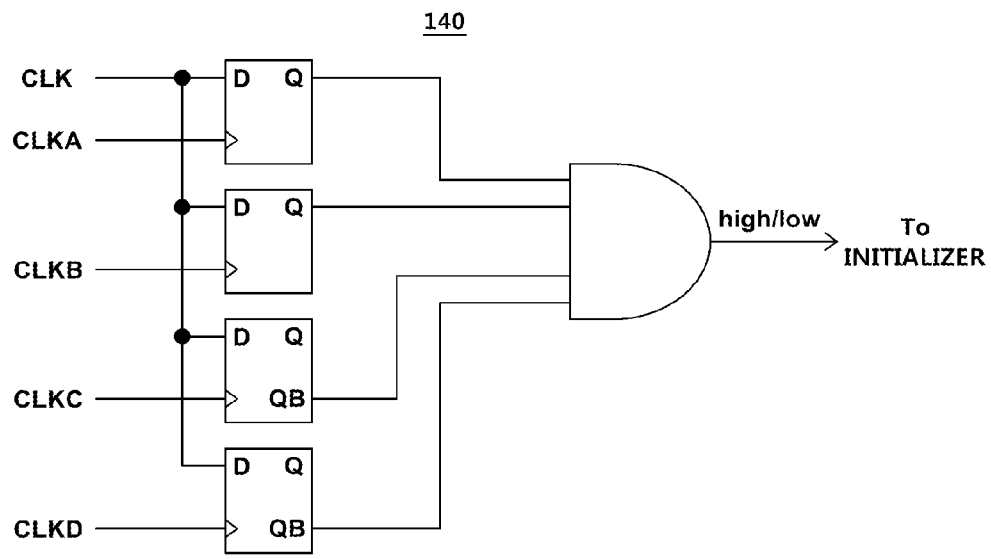
FIG. 4 is a circuit diagram of an interior of the lock detector of FIG. 3, according to an example.

FIG. 4 is a circuit diagram of an interior of the lock detector of FIG. 3, according to an example.

In the example of FIG. 4, the lock detector 140 includes four DQ flip-flops and one AND logic element, and outputs high logic signal or low logic signal according to whether the DLL is in a locking state or an unlocking state. Thus, the output of the lock detector 140 is a Boolean value that indicates whether the DLL is locked or not. For example, in a DLL unlocking state, the first reset signal is transmitted to the initializer 160.

Figure 5A:
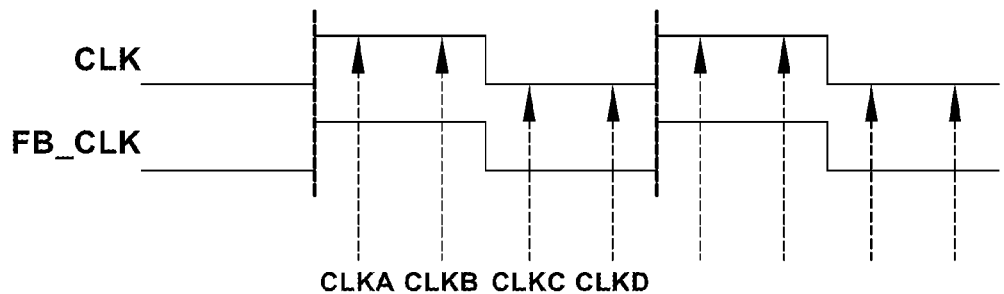
FIG. 5A is a timing view of a DLL locking state, according to an example.
Figure 5B:
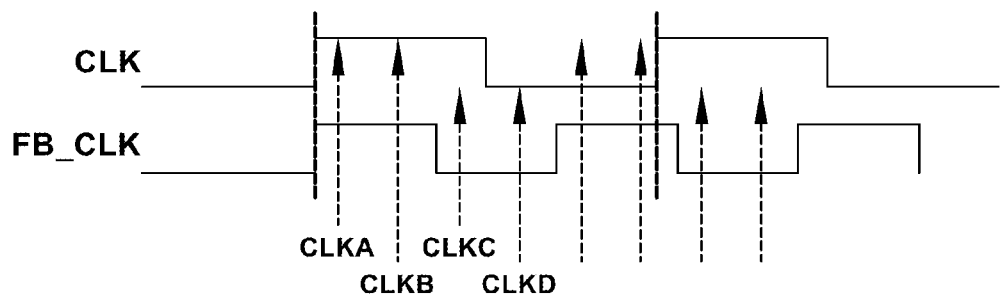
FIGS. 5B and 5C are timing views of DLL unlocking state, according to an example.
Figure 5C:
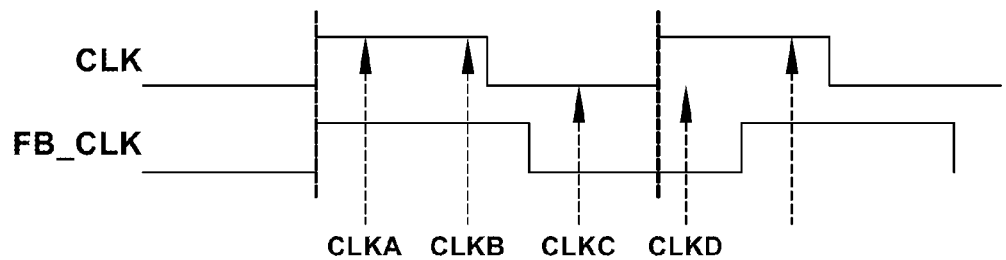

The process of detecting the DLL locking or unlocking state is explained below with reference to FIGS. 5A to 5C. FIGS. 5A to 5C help clarify how the lock detector 140 receives inputs and manages the DLL locking or unlocking state. In FIGS. 5A to 5C, the figures illustrate the CLK signal and the FB_CLK signal and how they are related to CLKA, CLKB, CLKC, and CLKD.

FIG. 5A is a timing view of the DLL locking state, according to an example.

FIG. 5A illustrates an example when the frequencies of the external clock signal (CLK) and feedback internal clock signal (FB_CLK) are synchronized. That is, these clock signals are in phase. In this case, clock A to clock D signals (CLKA, CLKB, CLKC, and CLKD) applied to the four DQ flip-flops shown in FIG. 4 have the corresponding logic values 'HHLL'. Accordingly, the AND logic element outputs a 'High' level signal, indicating that the DLL is in a locking state.

Alternatively, when the feedback internal clock signal (FB_CLK) is faster or slower than the external clock signal (CLK), as illustrated with reference to FIGS. 5B and 5C, the logic values of the clock A signal to clock D (CLKA, CLKB, CLKC, and CLKD) signal each have 'HHHL', or 'HHLH'. Accordingly, the AND logic element outputs 'Low' level signal, indicating that the DLL is not in a locking state and is to be reset.

The lock detector 140 detects the 'High' level signal or the 'Low' level signal outputted from the AND logic element based on the clock A to clock D signals (CLKA, CLKB, CLKC, and CLKD) and detects DLL locking and DLL unlocking states, accordingly.

Figure 6:
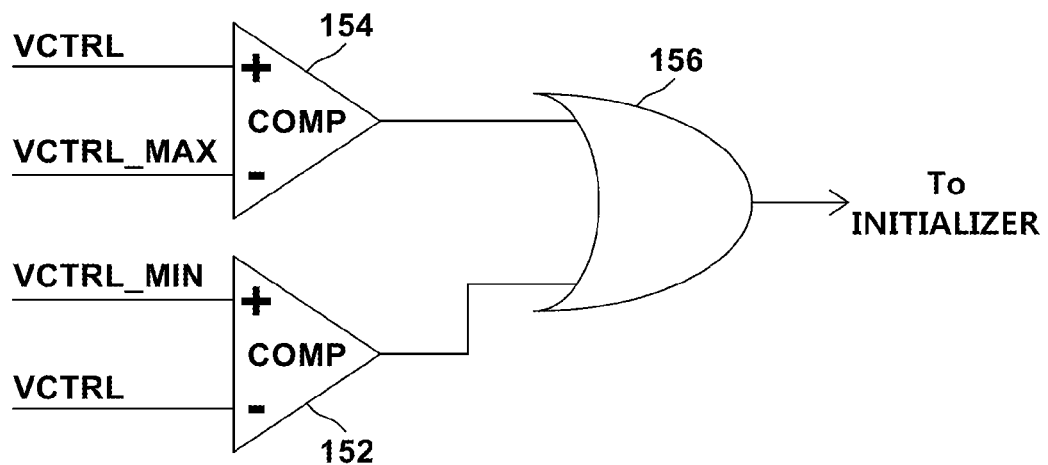
FIG. 6 is a circuit diagram of an interior of the level determiner of FIG. 3, according to an example.

FIG. 6 is a circuit diagram of an interior of the level determiner of FIG. 3, according to an example.

For the purpose of DLL locking, the level determiner 150 determines if the control signal voltage value (VCTRL) is in the normal operation domain. To do so, the level determiner 150 includes a first comparator 152 that compares the VCTRL and a minimum DLL locking voltage value (VCTRL_MIN), and a second comparator 154 that compares the VCTRL and maximum DLL locking voltage value (VCTRL_MAX).

The level determiner 150 also includes an OR gate 156 that outputs a second reset signal to the initializer 160 when the VCTRL is less than the VCTRL_MIN or exceeds the VCTRL_MAX.

Thus, the level determiner 150 outputs a reset signal when the VCTRL deviates from the normal operation domain, by exceeding VCTRL_MAX or by being less than VCTRL_MIN.

Figure 7:
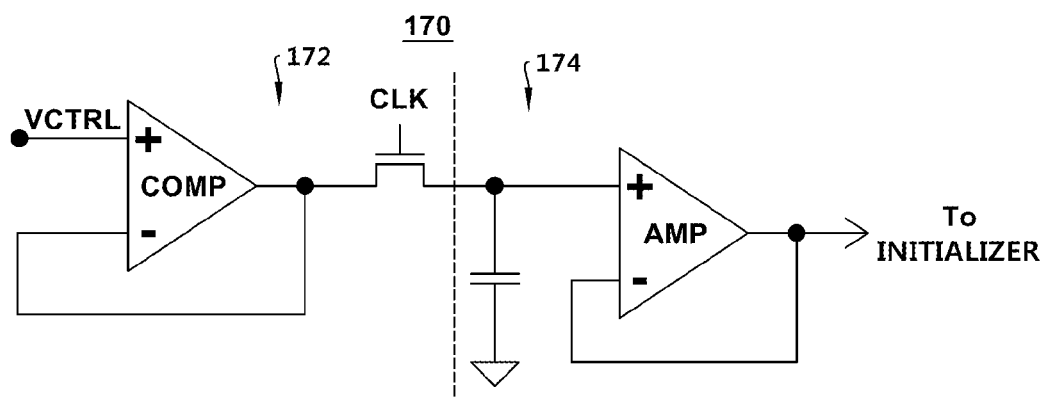
FIG. 7 is a circuit diagram of an interior of the storage of FIG. 3, according to an example.

FIG. 7 is a circuit diagram of an interior of the storage of FIG. 3, according to an example.

Referring to FIG. 7, the storage 170 includes two parts, a sampler 172 and a hold unit 174. The sampler 172 is synchronized to the external clock signal (CLK) and periodically samples the control signal voltage value (VCTRL) in locking state. The hold unit 174 stores the sampled control voltage value. Additionally, in an example, the sampler 172 and the hold unit 174 each include amplifiers.

The storage 170 acts to provide the initializer 160 with a previously stored reference voltage when the DLL is in the unlocking state and is to be initialized.

Figure 8:
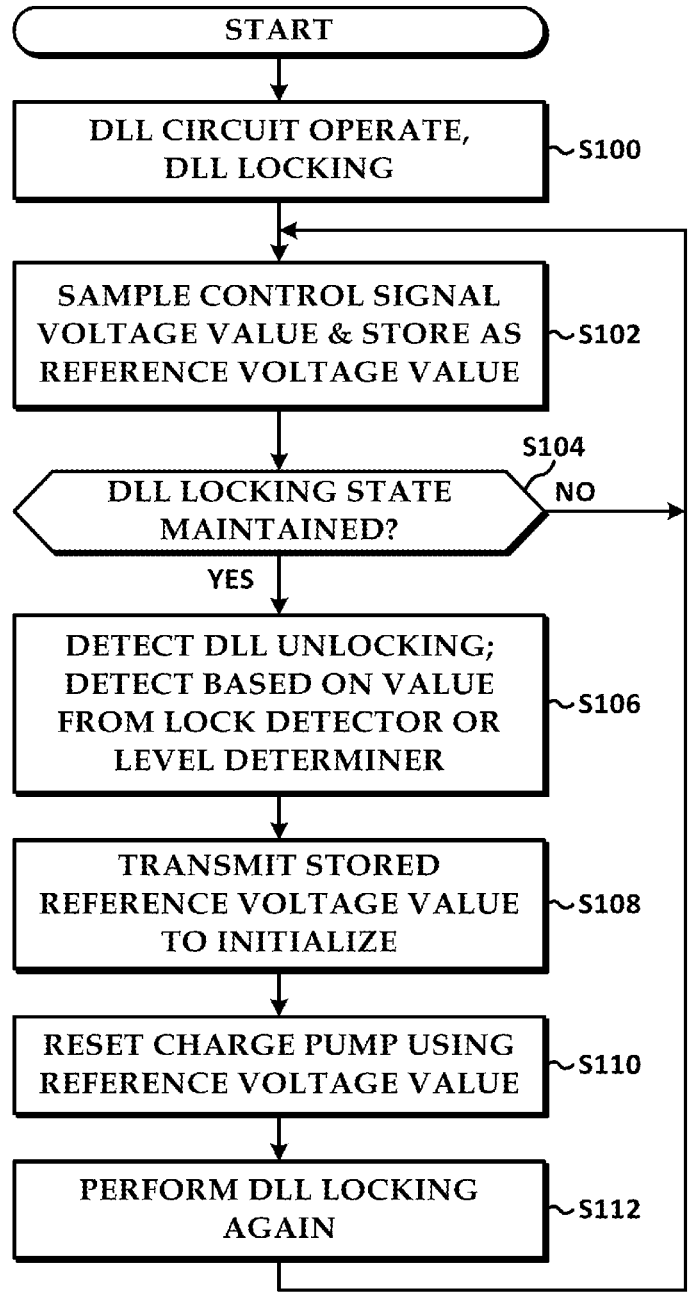
FIG. 8 is a flowchart provided to illustrate DLL locking method, according to an example.

The DLL locking process at the DLL circuit apparatus is explained, below. The DLL locking method according to an example is explained below with reference to FIG. 8, which is a flowchart illustrating such a method.

At S100, the method operates a DLL circuit and locks the DLL circuit. For example, when a mobile product that incorporates a DDI including a DLL circuit is on, the DLL circuit equipped in the DDI operates, and the DLL locking operation is performed. For example, such a mobile product may be a smart phone.

In the initial DLL locking operation of S100, the VCTRL starts from the high frequency domain and increases. The VCDL 130 increases the delay time according to the VCTRL of the CP 120. The VCDL 130 locates a locking point in the normal operation domain. In the DLL locking state, the initializer 160 does not transmit a reset signal to the CP 120, as the DLL is in the normal operation domain when locked.

At S102, the method samples the control signal voltage value and stores it as a reference voltage value. For example, in the DLL locking state, the storage 170 samples the VCTRL which is periodically outputted from the CP 120 and stores the same, at S102. The stored VCTRL value is taken to be the reference voltage value for subsequent DLL locking.

At S104, the method checks to see if the DLL maintains its locking state. When the DLL locking state is maintained, it is not necessary to perform additional processing for the DLL locking. Accordingly, the method returns to S102 so that the reference voltage value is stored.

However, at S104, when the VCTRL for the DLL locking varies, such as due to ESD or external noise, the VCTRL potentially deviates from the normal operation domain and varies into a high frequency or a low frequency domain. Thus, the operation of the DLL assumes an unlocking state in which the locking point deviates from the normal operation domain so that the VCDL 130 cannot adjust the external clock sufficiently to compensate for the delay time.

At S106, the method detects that the DLL has assumed an unlocking state, where the detecting is based on a value received from the lock detector or the level determiner. For example, at S106, the entry of the DLL into its unlocking state is determined based on at least one of the values from the lock detector 140 and the level determiner 150. That is, the entry of the DLL into its unlocking state is recognized when the initializer 160 receives a low logic signal from the lock detector 140 or receives a logic signal from the level determiner 150 which indicates deviation of the VCTRL from the normal operation domain.

Accordingly, the method performs the DLL locking to restore it to its locking state. As explained above, the DLL locking is performed when one of the output values from the lock detector 140 and the level determiner 150 is received that indicates that DLL locking is to be performed.

At S108, the method transmits a stored reference voltage value to carry out the initialization operation. For example, at S108, for the purpose of DLL locking, the initializer 160 receives the previously stored reference voltage value from the storage 170.

At S110, the method resets the charge pump using the reference voltage value. For example, at S110, the initializer 160 resets the CP 120 based on the reference voltage value provided by the storage 170.

When the CP 120 resets to the stored reference voltage value, the locking point currently located in the high frequency or low frequency domain is returned back to the normal operation domain based on the reference voltage value that was previously within the normal operation domain. The reference voltage value may be somewhat different from the locking point in the previous DLL locking state. However, DLL locking can be performed quickly, because the locking point is in the normal operation domain and the reference voltage value is readily available. In one example, the locking point is matched with the initial locking point when the DLL locking is performed again.

At S112, the method performs the DLL locking again. For example, at S112, when the second DLL locking operation is completed, the method returns to S102 so that the control signal voltage value is sampled and stored. Hence, in an example, the method repeats so that the DLL operates properly on an ongoing basis.

Thus, the method explained above continues, until the mobile product, such as a smart phone, is turned off.

As explained above, according to the examples, when a DLL assumes its unlocking state the CP 120 is reset based on the previously stored reference voltage value. For example, the CP 120 is reset as the phase difference of the clock signals is detected at the lock detector 140 or as the VCTRL for DLL locking is varied. Resetting the CP 120 in such a manner enables faster DLL locking process than an alternative example in which the control signal voltage value for the DLL locking is moved from the DLL unlocking state for the purpose of DLL locking.

According to an example, several is taken to transition between a DLL unlocking state and a DLL locking state, which is reduced from the several dozens of μs that other methods require to transition between an DLL unlocking state and an DLL locking state.

The above process is explained again below with reference to FIGS. 9 and 10.

Figure 9:
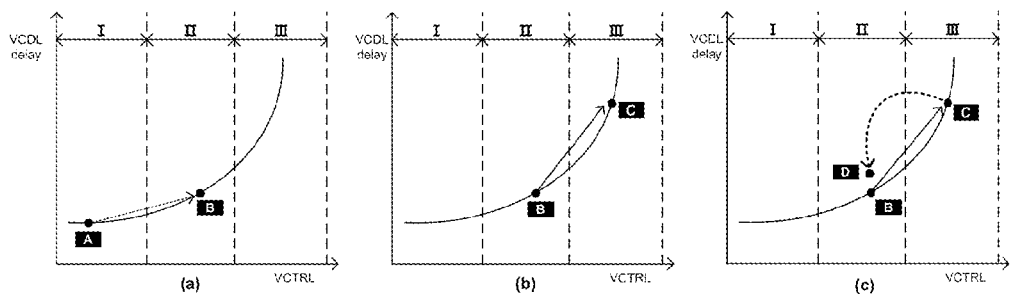
FIGS. 9 and 10 are graphs representing progression from initial DLL locking state to DLL unlocking, and then back to DLL locking, according to an example.
Figure 10:
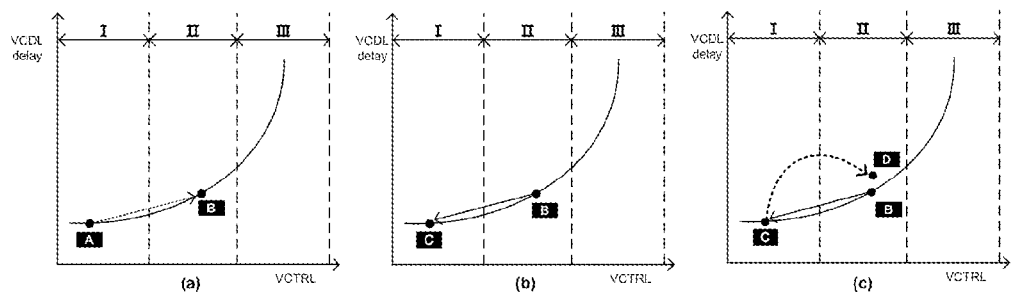

FIGS. 9 and 10 are graphs illustrating the progression between an initial DLL locking state and a DLL unlocking state, and progression back to a DLL locking state, according to an example. In explaining the example with reference to the graphs, the architecture of the DLL apparatus is omitted for the sake of brevity. Here, the process of indicating DLL locking and DLL unlocking states is explained. Additionally, the case where the locking point is changed from the normal operation domain (II) to low frequency area (III) and the case where the locking point is changed from the normal operation domain (II) to high frequency area (I) are also respectively explained.

FIG. 9 illustrates an example where the locking point is DLL unlocked from the normal operation domain (II) to a low frequency area (III).

Referring to FIG. 9A, when the DLL circuit is initially driven, the locking point is moved from the high frequency domain (I) (point A) to the normal operation domain (II) (point B).

In such a situation, when ESD or external noise occurs, referring to FIG. 9B, the locking point is further moved to the low frequency domain (III) (point C) to place the DLL into an unlocking state.

Accordingly, the DLL circuit is reset to a previously stored reference voltage value. The locking point (point C) in the low frequency domain (III) is moved back to the normal operation domain (II) (point D), and the DLL locking is finished. FIG. 9C illustrates an example where the DLL locking is performed again when the DLL is in its unlocking state, thus moving the locking point to the normal operation domain (II) again so that it operates properly.

Although the locking point (point B) of FIG. 9B and the locking point (point D) by the stored reference voltage value are somewhat different from each other, since both are located in the normal operation domain (II), DLL locking is performed quickly.

FIG. 10 illustrates an example where the locking point is DLL unlocked from the normal operation domain to a high frequency domain.

Referring to FIG. 10A, point A is moved to point B and it is then in the DLL locking state.

However, when ESD or external noise is generated, referring to FIG. 10B, in this example the locking point moves back to the high frequency domain (I) (point C).

In this case, the DLL circuit is reset using a previously stored reference voltage value. Accordingly, the locking point (point) in the high frequency domain (I) is moved back to the normal operation domain (II) (point D) as shown in FIG. 10C, and the DLL locking is completed.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A delay-locked loop (DLL) circuit apparatus comprising:
    a storage configured to store a control signal voltage value corresponding to a DLL locking state as a reference voltage value;
    a lock detector configured to determine when a DLL unlocking state occurs using an external clock signal and a feedback internal clock signal;
    a level determiner configured to determine when a DLL unlocking state occurs using a level of a control signal voltage value; and
    an initializer configured to receive a reset signal from at least one of the lock detector and the level determiner in response to determining that the DLL unlocking state occurs, and configured to reset a control signal voltage value of the DLL circuit apparatus to the reference voltage value as stored in the storage in response to receiving the reset signal.

2. The DLL circuit apparatus of claim 1, wherein the lock detector is configured to detect a phase difference between the external clock signal and the feedback internal clock signal, and configured to determine that the DLL unlocking state occurs in response to detecting the phase difference.

3. The DLL circuit apparatus of claim 2, wherein the lock detector comprises:
    a plurality of flip-flops configured to receive the external clock signal and the feedback internal clock signal; and
    an AND gate configured to calculate an AND operation of output signals received from the flip-flops and output the result of the AND operation as a high logic signal or a low logic signal.

4. The DLL circuit apparatus of claim 3, wherein the plurality of flip-flops are DQ flip-flops.

5. The DLL circuit apparatus of claim 3, wherein the result of the AND operation is transmitted to the initializer as a reset signal.

6. The DLL circuit apparatus of claim 1, wherein the level determiner comprises:
    a first comparator configured to compare the control signal voltage value with a minimum DLL locking voltage value;
    a second comparator configured to compare the control signal voltage value with a maximum DLL locking voltage value; and
    an OR gate configured to output the reset signal to the initializer in response to the control signal voltage value being less than the minimum DLL locking voltage value or greater than the maximum DLL locking voltage value.

7. The DLL circuit apparatus of claim 2, wherein the storage comprises:
    a sampler configured to sample the control signal voltage value in synchronization with the external clock signal, when the DLL circuit apparatus is in a locking state; and
    a hold unit configured to store the sampled control signal voltage value.

8. The DLL circuit apparatus of claim 7, wherein at least one of the sampler and the hold unit further comprises an amplifier.

9. The DLL circuit apparatus of claim 7, wherein the hold unit is configured to provide the stored control signal voltage value to the initializer as the reference voltage value.

10. A delay-locked loop (DLL) locking method, comprising:
    storing a control signal voltage value corresponding to a DLL locking state as a reference voltage value;
    determining when a DLL unlocking state occurs by comparing an external clock signal and a feedback internal clock signal, or by detecting a change in level of the control signal voltage value; and
    performing DLL locking by resetting the control signal voltage value in the DLL unlocking to the stored reference voltage value in response to detecting the DLL unlocking.

11. The DLL locking method of claim 10, wherein determining when a DLL unlocking state occurs comprises comparing phases of the external clock signal and the feedback internal clock signal.

12. The DLL locking method of claim 11, wherein the detecting when the DLL unlocking state further comprises determining that the DLL unlocking occurs in response to the phases being different.

13. The DLL locking method of claim 10, wherein the detecting that the DLL unlocking occurs comprises determining that the DLL unlocking occurs in response to the control signal voltage value deviating from a normal operation range.

14. The DLL locking method of claim 13, wherein the normal operation range is a normal operation range of a voltage controlled delay line for receiving the control signal voltage value and generating an internal clock signal.

15. The DLL locking method of claim 10, wherein resetting the control signal voltage value in the DLL comprises changing a setting of a charge pump of the DLL.

16. A delay-locked loop (DLL) circuit apparatus comprising:

a lock detector configured to generate a reset signal in response to a DLL unlocking state being determined to occur using an external clock signal and a feedback internal clock signal;

a level determiner configured to generate a reset signal in response to a DLL unlocking state being determined to occur using a level of a control signal voltage value; and an initializer configured to reset a control signal voltage value of the DLL circuit apparatus to a stored reference voltage value corresponding to a DLL locking state in response to the reset signal being generated.

17. The DLL circuit apparatus of claim 16, wherein the lock detector is configured to detect a phase difference between the external clock signal and the feedback internal clock signal, and configured to generate the reset signal in response to detecting the phase difference.

18. The DLL circuit apparatus of claim 16, further comprising a storage configured to store a control signal voltage value corresponding to a DLL locking state as the reference voltage value.

19. The DLL circuit apparatus of claim 16, wherein the level determiner comprises:

a first comparator configured to compare the control signal voltage value with a minimum DLL locking voltage value;

a second comparator configured to compare the control signal voltage value with a maximum DLL locking voltage value; and an OR gate configured to generate the reset signal in response to the control signal voltage value being less than the minimum DLL locking voltage value or greater than the maximum DLL locking voltage value.

* * * * *